United States Patent
Wu et al.

(10) Patent No.: US 7,037,841 B2
(45) Date of Patent: May 2, 2006

(54) DUAL DAMASCENE INTERCONNECTING LINE STRUCTURE AND FABRICATION METHOD THEREOF

(75) Inventors: Meng-Wei Wu, Hsinchu (TW); En-Shan Liang, Taoyuan County (TW); Keng-Yao Lee, Hsinchu (TW); Su-Hua Wu, Miaoli County (TW)

(73) Assignee: Winbond Electronics Corp., Hsinchu (TW)

( * ) Notice: Subject to any disclaimer, the term of this patent is extended or adjusted under 35 U.S.C. 154(b) by 243 days.

(21) Appl. No.: 10/768,166

(22) Filed: Feb. 2, 2004

(65) Prior Publication Data
US 2005/0026446 A1    Feb. 3, 2005

(30) Foreign Application Priority Data
Jul. 31, 2003    (TW) .............. 92120946 A

(51) Int. Cl.
*H01L 21/311* (2006.01)
(52) U.S. Cl. .............. 438/700; 438/618; 438/702; 438/725
(58) Field of Classification Search .......... 438/618, 438/622, 623, 624, 700, 702, 703, 720, 723, 438/724, 725
See application file for complete search history.

(56) References Cited

U.S. PATENT DOCUMENTS

| | | | |
|---|---|---|---|
| 6,271,593 B1 | 8/2001 | Givens et al. | |
| 6,440,842 B1 * | 8/2002 | Chang | 438/633 |
| 6,455,436 B1 * | 9/2002 | Ueda et al. | 438/706 |
| 6,498,092 B1 | 12/2002 | Lee et al. | |
| 6,642,138 B1 * | 11/2003 | Pan et al. | 438/619 |
| 6,787,448 B1 * | 9/2004 | Chung | 438/624 |
| 6,924,228 B1 * | 8/2005 | Kim et al. | 438/636 |
| 2002/0177301 A1 * | 11/2002 | Biolsi et al. | 438/637 |
| 2003/0170978 A1 * | 9/2003 | Lee | 438/638 |
| 2004/0110370 A1 * | 6/2004 | Okayama et al. | 438/638 |

* cited by examiner

Primary Examiner—Kin-Chan Chen
(74) Attorney, Agent, or Firm—Birch Stewart Kolasch & Birch LLP

(57) ABSTRACT

A method for fabricating a semiconductor device having a dual damascene opening structure. The method includes the steps of providing a substrate having a dielectric layer thereon. A first photoresist layer having a via contact hole pattern is formed on the dielectric layer. A sacrificial layer is formed on the first photoresist layer and fills up the via contact hole pattern. A second photoresist layer having an interconnect trench pattern is formed on the sacrificial layer, thereby exposing the sacrificial layer beneath the interconnect trench pattern. The interconnect trench pattern is transferred to the sacrificial layer using the second photoresist layer as a mask. The first photoresist layer and the dielectric layer are sequentially etched using the second photoresist layer as a mask, thereby transferring the interconnect trench pattern to the dielectric layer, forming an interconnect trench, and further continuously etching the dielectric layer along the via contact hole pattern to form a via contact hole in the dielectric layer.

18 Claims, 8 Drawing Sheets

DUAL DAMASCENE INTERCONNECTING LINE STRUCTURE AND FABRICATION METHOD THEREOF

This Nonprovisional application claims priority under 35 U.S.C. §119(a) on Patent Application No(s). 092120946 filed in TAIWAN on Jul. 31, 2003, the entire contents of which are hereby incorporated by reference.

BACKGROUND OF THE INVENTION

1. Field of the Invention

The present invention relates to a fabrication method for a semiconductor device, and more particularly, to a method of fabricating a semiconductor device having a dual damascene interconnecting line structure.

2. Description of the Related Art

As the density of components in integrated circuits increases, the highly conductive components of an integrated circuit must be extremely small to provide enough space for the other components. Meanwhile, back end of line (BEOL) processes integrate an increasing number of dual-damascene interconnect techniques to meet the stringent requirements of state of the art metal interconnect processes. However, the RC delay associated with metal interconnect is detrimental to the circuit performance. In order to reduce circuit capacitance, low-k dielectric materials are used and new conductive materials, multi-level structures and patterning techniques are being investigated.

Although conventional conductive components perform adequately for many applications, highly conductive components are beginning to limit the performance of extremely high density integrated circuits with very small components because the resistance per unit length of long, narrow conductive lines is undesirably high. Aluminum is desirable for short or wide conductive features, but it is too resistive for use in long, narrow conductive components. Tungsten is also used for conductive components, but it is difficult to fill small voids in dielectric layers with tungsten.

Generally, copper is more conductive than aluminum, but the resistance per unit length of copper conductive components may be too high for long, narrow conductive lines because copper loses an electron to the surrounding silicon and silicon oxide layers. Additionally, it is difficult to dry-etch a copper line due to the low vapor pressure of by-products during a dry etching process. Moreover, copper lines are particularly subject to corrosion such that it is difficult to use a copper line as a metal line in a semiconductor device. Typically, copper lines have lower resistance than other existing metal lines and also have excellent electro-migration properties.

Under the limitations mentioned above, the conventional process of fabricating a dual-damascene interconnecting line structure is more complex when two steps of lithography and etching are used. Additionally, between the steps of lithography and etching, there is a residual photoresist problem resulting in lower yield.

FIGS. 1A to 1E are cross-sections illustrating conventional methods of forming a dual damascene interconnecting line structure in a semiconductor device. Referring now to FIG. 1A, a first conductive layer 11 is formed on a semiconductor substrate 10, and then a first interlayer dielectric layer 12 is formed on the first conductive layer 11.

Referring to FIG. 1B, a first photoresist layer 15 having a via contact hole pattern is subsequently formed on the first interlayer dielectric layer 12. The first interlayer dielectric layer 12 is etched using the first photoresist layer 15 as a mask, thereby forming a via contact hole 16 exposing the first conductive layer 11.

Referring to FIG. 1C, a second photoresist layer 17 having an interconnect trench pattern is formed on a second interlayer dielectric layer 14. The second interlayer dielectric layer 14 is etched using the second photoresist layer 17 as a mask, thereby forming an interconnect trench 18 in the second interlayer dielectric layer 14. Thus, a dual-damascene opening structure 19 is achieved.

Referring to FIG. 1D, a second conductive layer 20 is formed on the second interlayer dielectric layer 14 and fills the interconnect trench 18 and the dual-damascene opening structure 19.

Referring to FIG. 1D, the second conductive layer 20 above the second interlayer dielectric layer 14 is removed to construct a dual damascene interconnecting line structure 21 with a plurality of contact vias and a damascene interconnecting line structure.

U.S. Pat. No. 6,498,092 discloses three possible options available for the formation of dual damascene structures: via-first, trench-first and a self-aligned process (also called buried-via). These three methods all require an etch stop layer with high dielectric constant, due to this, parasitic capacitance in the interlayer insulation layers is increased, thereby increasing RC delay during the operation of a semiconductor device.

U.S. Pat. No. 6,271,593 discloses a method and substrate structure for fabricating highly conductive components on microelectronic devices. However, a dielectric stratum having a high dielectric constant is used between the interlayer insulation layers, due to this; parasitic capacitance in the interlayer insulation layers is increased, thereby increasing RC delay during the operation of a semiconductor device.

SUMMARY OF THE INVENTION

An object of the present invention is to provide a method for fabricating of semiconductor device having a dual damascene interconnecting line structure.

Another object of the present invention is to provide a fabrication method using a tri-layer photoresist for a dual damascene interconnecting line structure, thereby simplifying the fabrication procedure and reducing manufacturing cost.

In order to achieve these objects, the present invention provides a method for fabricating a semiconductor device having a dual damascene opening, comprising the steps of: providing a substrate having a dielectric layer thereon; forming a first photoresist layer having a via contact hole pattern on the dielectric layer; forming a sacrificial layer on the first photoresist layer and filling up the via contact hole pattern; forming a second photoresist layer having an interconnect trench pattern on the sacrificial layer, thereby exposing the sacrificial layer beneath the interconnect trench pattern; transferring the interconnect trench pattern into the sacrificial layer using the second photoresist layer as a mask; and etching the first photoresist layer and the dielectric layer sequentially using the second photoresist layer as a mask, thereby transferring the interconnect trench pattern to the dielectric layer and forming an interconnect trench, and further continuously etching the dielectric along the via contact hole pattern to form a via contact hole in the dielectric layer.

The dielectric layer may preferably include a material selected from the group consisting of $SiO_2$, borosilicate glass (BSG), borophosphate silicate glass (BPSG), fluorosilicate glass (FSG), and tetra-ethyl-ortho-silicate (TEOS).

The first and second photoresists are preferably formed by a deep ultra violet photoresist. The first and second photoresists are selected from different photo resists. The sacrificial layer may be an I-line photoresist or non-photosensitive photoresist.

In one embodiment of the present invention, the method for fabricating a dual damascene interconnecting line structure may further comprise the steps of forming a conductive layer on the dielectric layer and filling the via contact hole and the interconnect trench; and polishing the conductive layer until exposing the dielectric layer to achieve a damascene interconnecting line structure with a via contact.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

FIGS. 2A to 2I are cross-sections illustrating a method of forming a dual damascene interconnecting line structure in a semiconductor device according to a preferred embodiment of the present invention.

Figure 1A:
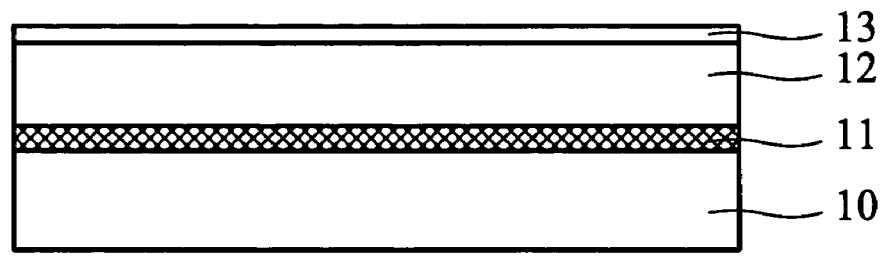
FIGS. 1A through 1E are cross-sections illustrating conventional methods of forming a dual damascene interconnecting line structure.
Figure 1B:
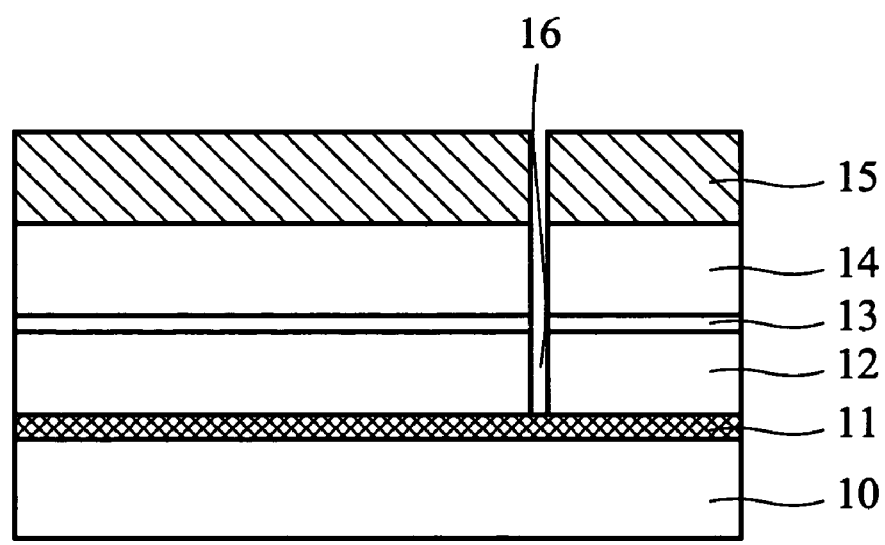
Figure 1C:
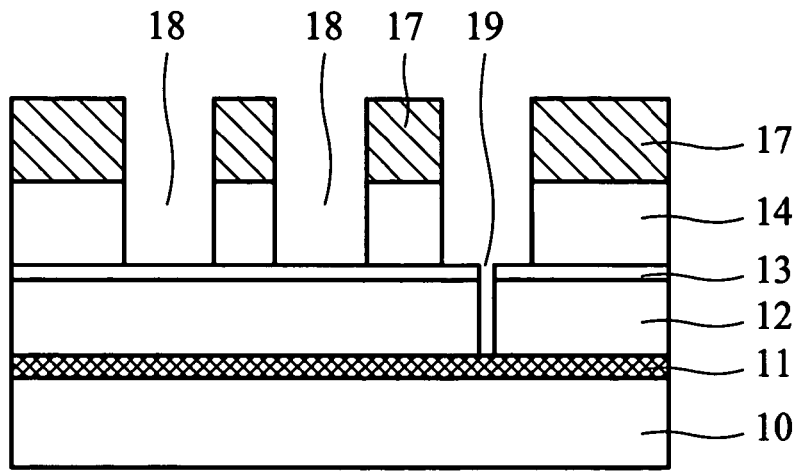
Figure 1D:
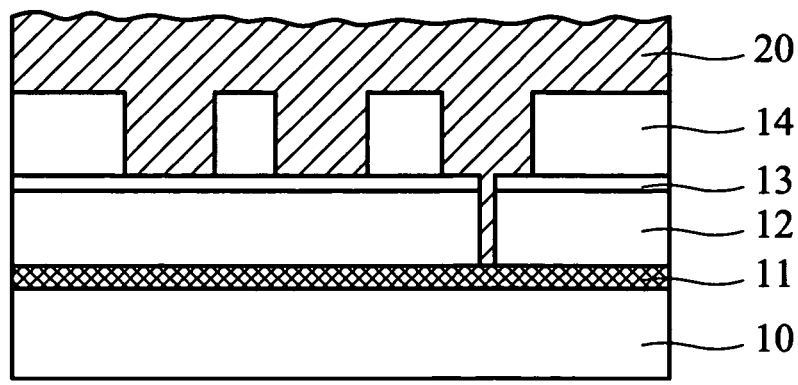
Figure 1E:
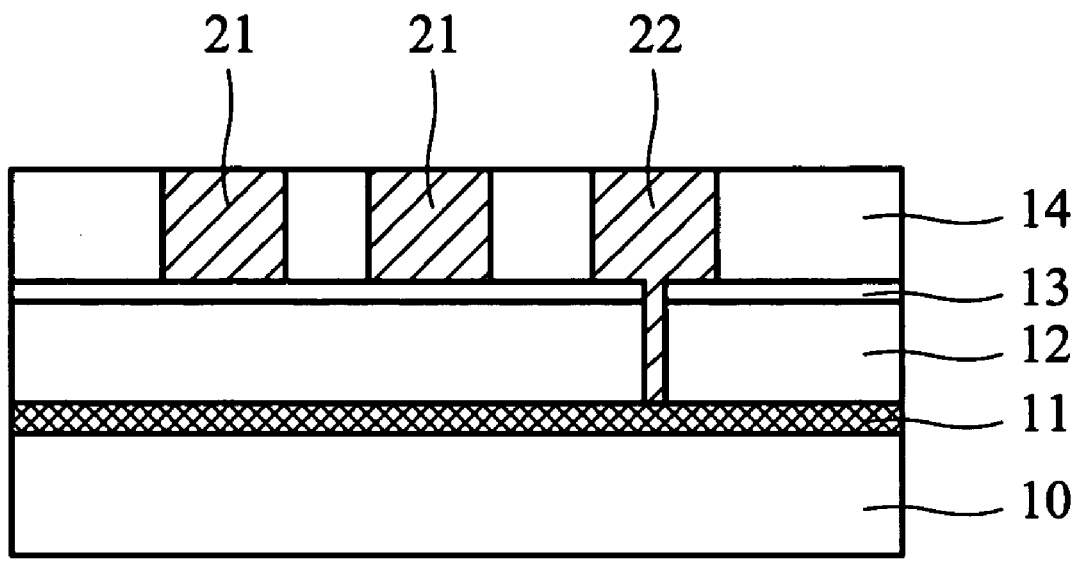
Figure 2A:
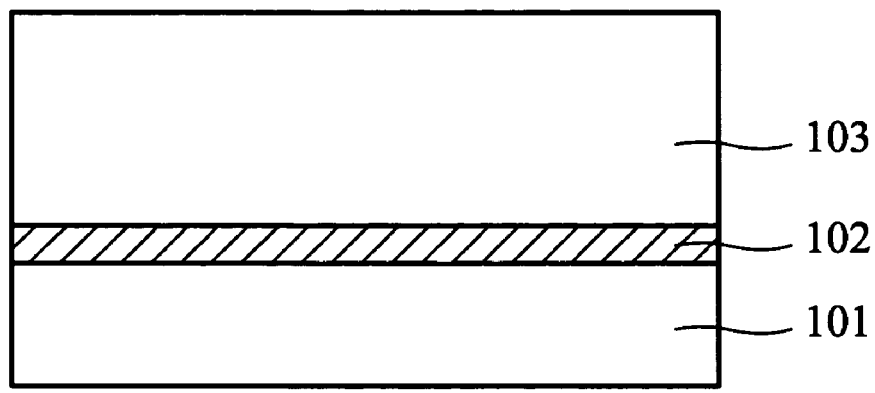
FIGS. 2A through 2I are cross-sections illustrating methods of forming a dual damascene interconnecting line structure according to the preferred embodiment of the present invention.

Referring to FIG. 2A, a first conductive layer 102 is formed on a semiconductor substrate 101 (e.g., silicon substrate), and then an interlayer dielectric layer 103 is formed on the first conductive layer 102. The interlayer dielectric layer 103 may preferably include a material selected from the group consisting of $SiO_2$, borosilicate glass (BSG), borophosphate silicate glass (BPSG), fluorosilicate glass (FSG), and tetra-ethyl-ortho-silicate (TEOS).

Figure 2B:
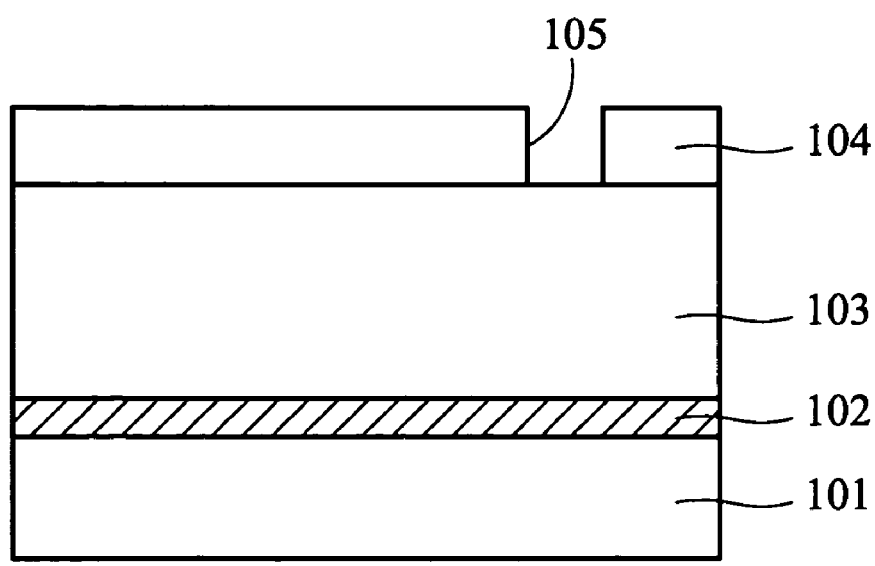

Referring to FIG. 2B, a first photoresist layer 104 having a via contact hole pattern 105 is subsequently formed on the interlayer dielectric layer 103. The first photoresist layer 104 can be a chemically amplified silicon photoresist or deep ultra violet (DUV) photoresist.

Figure 2C:
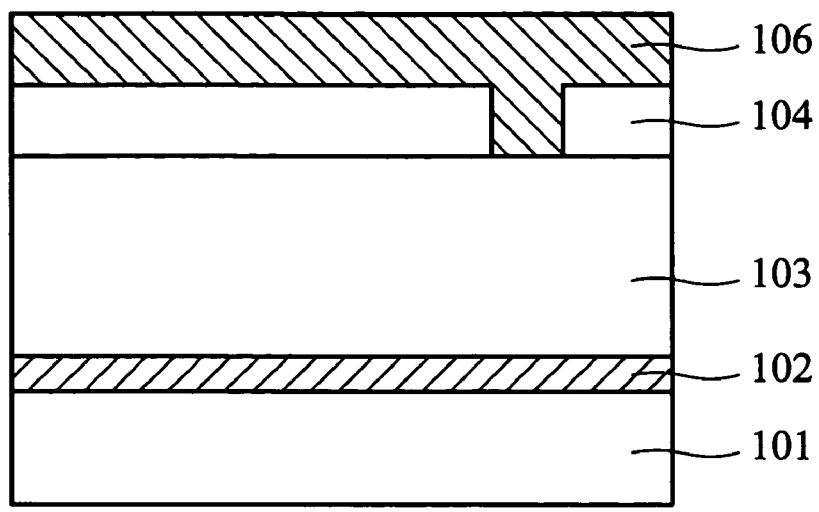
Figure 2D:
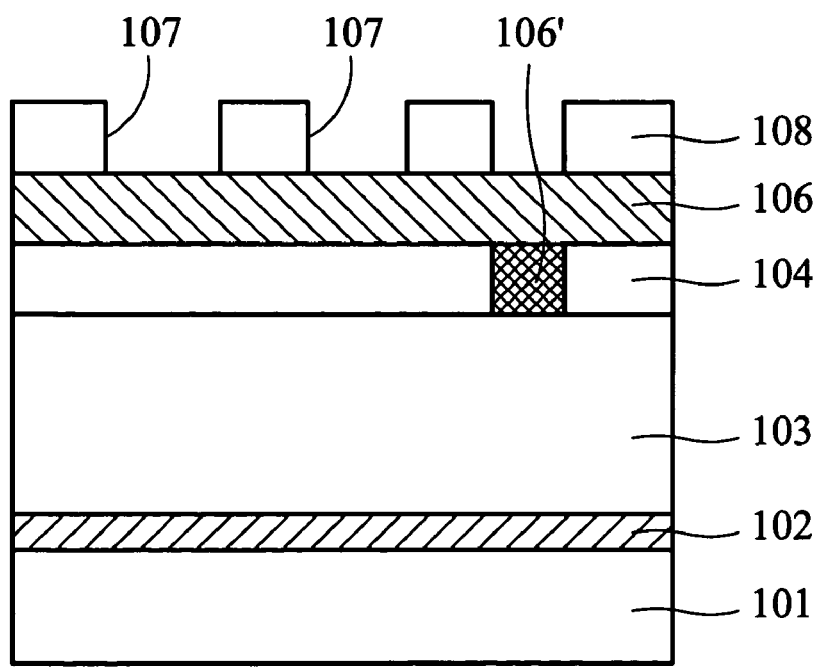

Referring to FIG. 2C, a sacrificial layer 106 is formed on the first photoresist layer 104 and fills up the via contact hole pattern 105. The sacrificial layer 106 can be I-line photoresist. Next, a second photoresist layer 108 having an interconnect trench 107 on the sacrificial layer 106, thereby exposing the sacrificial layer 106 beneath the interconnect trench 107 as shown in FIG. 2D. The second photoresist layer 108 can be chemically amplified silicon photoresist or deep ultra violet (DUV) photoresist.

In one embodiment, the first and second photoresists are chemically amplified silicon photoresist or deep ultra violet (DUV) photoresist. The thickness of the first and second photoresists is about 1000 to 5000 Å. The first and second photoresists can also be selected from different photoresists.

The sacrificial layer is I-line photoresist. The thickness of the sacrificial layer is about 4000 to 12000 Å. The sacrificial layer can be non-photosensitive photoresist having a higher etching rate than the etch rate of the first or second photoresist.

Figure 2E:
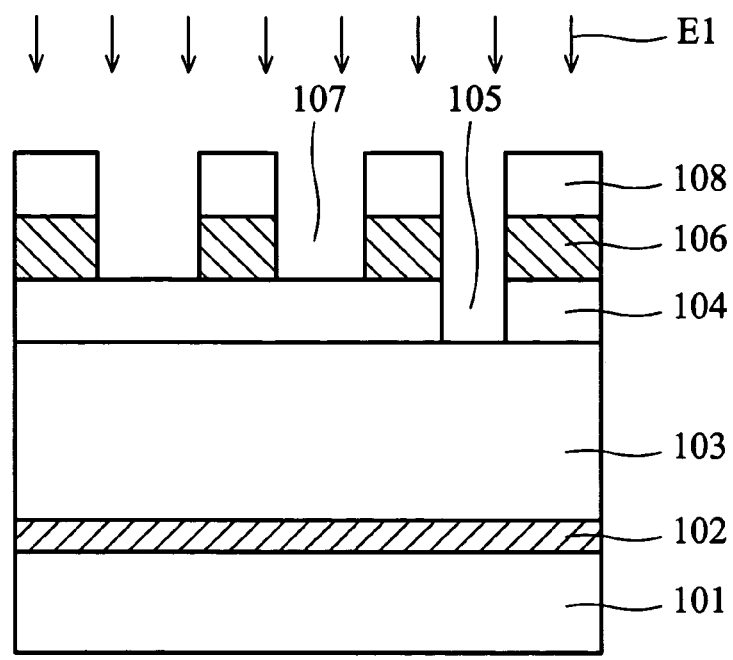

Referring to FIG. 2E, a first anisotropic etching E1 is performed on the sacrificial layer 106 using the second photoresist layer 108 as a mask. The first anisotropic etching E1 includes reactive ion etching (RIE) or plasma etching. The etching rate of the sacrificial layer 106 is higher than the etching rate of the first or second photoresist, wherein the ratio of the etching rates of the sacrificial layer 106 and the first or second photoresist is about 5–15:1. The interconnect trench pattern 107 is transferred to the sacrificial layer 106. Because the etching rate of the sacrificial layer 106 is higher than the etching rate of the second photoresist 108, the sacrificial layer 106' within the via contact hole 105 can be etched exposing the dielectric layer 103.

Figure 2F:
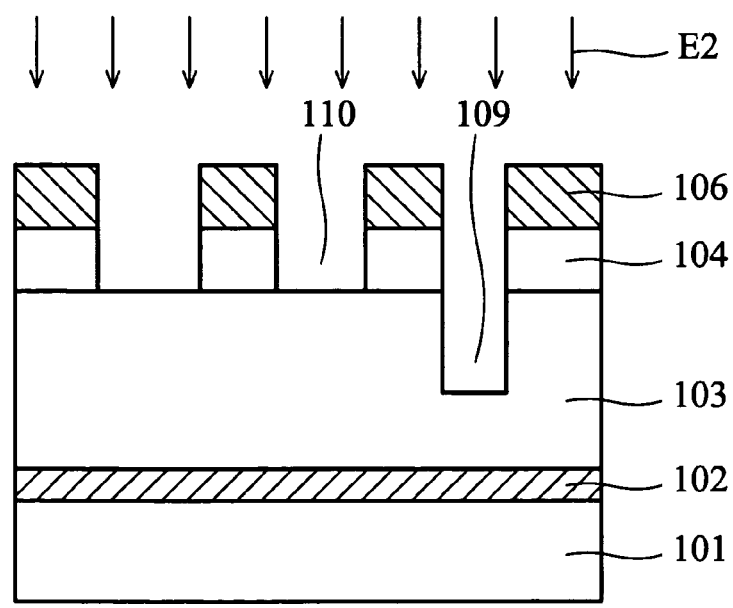

Referring to FIG. 2F, a second anisotropic etching E2 is performed on the first photoresist layer 104 and the dielectric layer 103 using the second photoresist layer 108 as a mask. The second anisotropic etching E2 includes reactive ion etching (RIE) or plasma etching. The etching parameters are selected from which the etching rates of the sacrificial layer 106 and the second photoresist layer 108 are equivalent. When the second photoresist layer 108 is etched exposing the sacrificial layer 106, the interconnect trench pattern 107 can be transferred to the first photoresist layer 104. The dielectric layer 103 is etched along the via contact hole pattern 105.

Figure 2G:
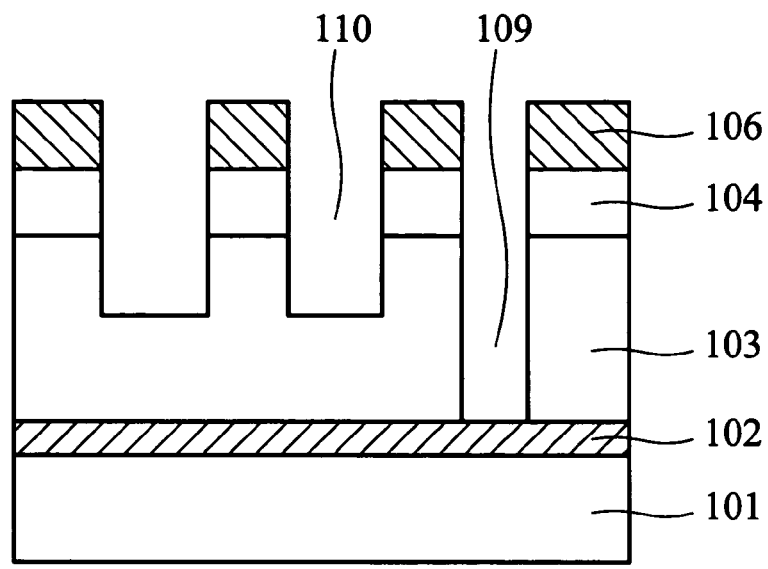
Figure 2H:
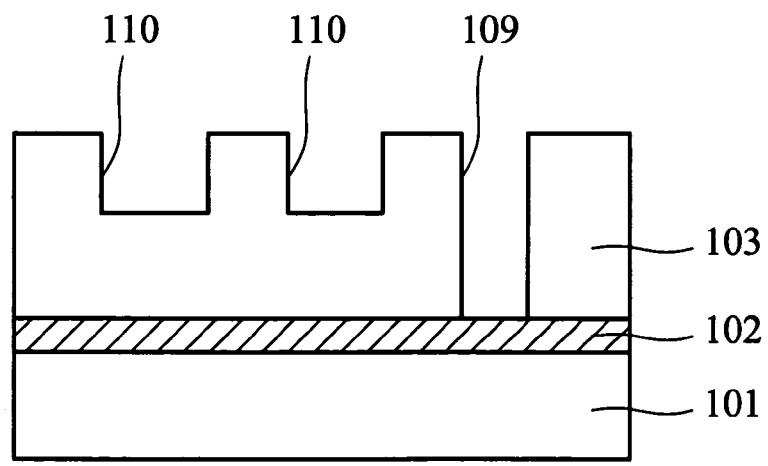

Referring to FIG. 2G, a reactive ion etching is performed on the dielectric layer 103 using the sacrificial layer 106 as a mask. The etching parameters are selected based on the etching rate of the dielectric layer 103 being higher than the etching rate of the first photoresist 104. The interconnect trench pattern 107 is transferred to the dielectric layer 103, then keep etching the dielectric layer 103 until the via contact 105 exposes the first conductive layer 102, thereby forming a via contact hole 109 in the dielectric layer 103. Thereafter, the sacrificial layer 106 and the first photoresist layer 104 are removed to achieve a dual damascene opening structure.

Figure 2I:
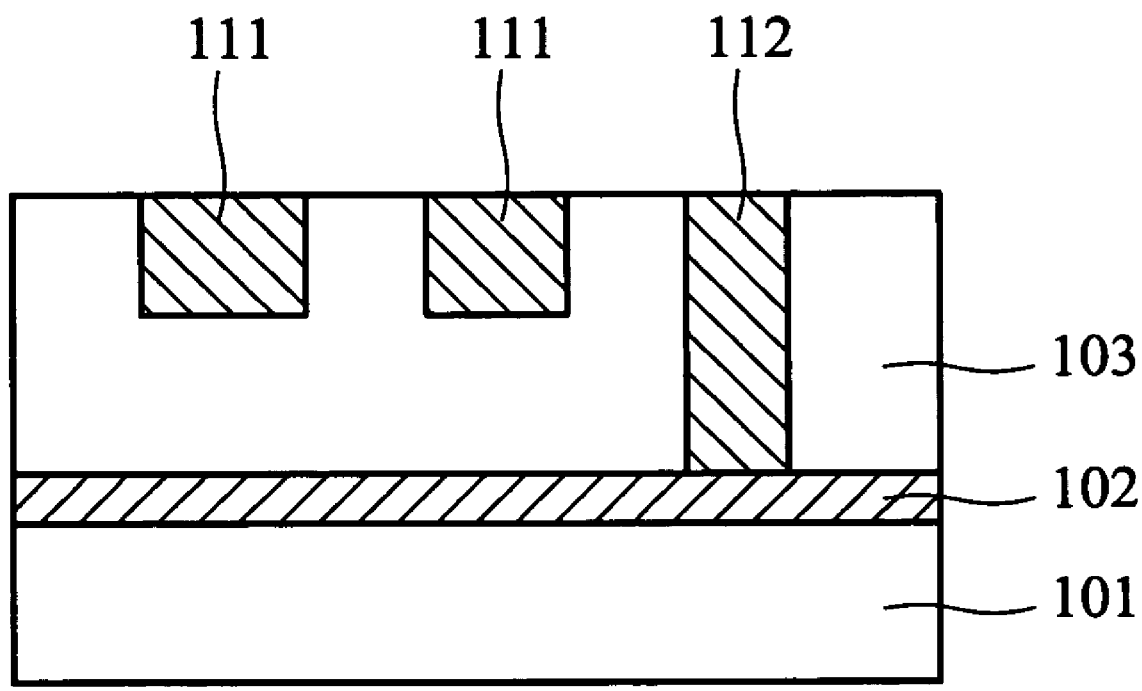

Referring to FIG. 2I, a second conductive layer (not shown) is formed on the dual damascene opening structure filling the via contact hole 109 and the interconnect trench 110. The second conductive layer is made of Au, Cu, Ag, Al, W, or alloys thereof. It is preferable that the second conductive consist of Cu. A planarization is performed on the second conductive layer until exposing the dielectric layer 103. The dual damascene interconnecting line structure 111 having via contact 112 is thus completed. The planarization method is etch-back or chemical mechanical polishing (CMP).

As shown in the preferred embodiment, the present invention provides a method for fabricating a dual damascene interconnecting line structure using a simplified process, thereby decreasing manufacturing cost. The depth of the interconnect trench is adjustable by altering the etching parameters, thereby changing the etching rate ratio of the first or second photoresist and the etching rate of the sacrificial layer.

In the preferred embodiments described, the advantage of the method for fabricating a dual damascene interconnecting line structure is the use of tri-layer photoresists for a dual damascene interconnecting line structure, thereby simplifying the fabrication procedure and reducing manufacturing costs.

Another advantage of the present invention is the method for fabricating a dual damascene interconnecting line structure without requiring an etch stop layer with high dielectric constant. Parasitic capacitance in the interlayer insulation layers is then decreased, and RC delay during operation of the semiconductor device decreases accordingly.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for fabricating a semiconductor device having a dual damascene interconnecting line structure, comprising the steps of:

providing a substrate having a dielectric layer thereon;

forming a first photoresist layer having a via contact hole pattern on the dielectric layer;

forming a sacrificial layer on the first photoresist layer and filling up the via contact hole pattern;

forming a second photoresist layer having an interconnect trench pattern on the sacrificial layer, thereby exposing the sacrificial layer beneath the interconnect trench pattern;

transferring the interconnect trench pattern to the sacrificial layer using the second photoresist layer as a mask; and etching the first photoresist layer and the dielectric layer using the second photoresist layer as a mask, thereby transferring the interconnect trench pattern to the dielectric layer and forming an interconnect trench, and continuously etching the dielectric layer along the via contact hole pattern to form a via contact hole in the dielectric layer.

2. The method as claimed in claim 1, wherein the dielectric layer includes a material selected from the group consisting of $SiO_2$, borosilicate glass (BSG), borophosphate silicate glass (BPSG), fluorosilicate glass (FSG), and tetra-ethyl-ortho-silicate (TEOS).

3. The method as claimed in claim 1, wherein the first and second photoresists are chemically amplified silicon photoresist.

4. The method as claimed in claim 1, wherein the first and second photoresists are selected from different photoresists.

5. The method as claimed in claim 1, wherein the sacrificial layer is I-line photoresist.

6. The method as claimed in claim 1, wherein the depth of the interconnect trench is adjustable by altering etching parameters, thereby changing the etching rate ratio of the first or second photoresist and the etching rate of the sacrificial layer.

7. The method as claimed in claim 1, wherein during etching the sacrificial layer and the first photo resist, the etching rates of the dielectric layer and the first photoresist layer are equivalent.

8. A method for fabricating a semiconductor device having a dual damascene interconnecting line structure, comprising the steps of:

providing a substrate having a metal layer thereon;

forming a dielectric layer on the metal layer;

forming a first photoresist layer having a via contact hole pattern on the dielectric layer;

forming a second photoresist layer on the first photoresist layer and filling up the via contact hole pattern;

forming a third photoresist layer having an interconnect trench pattern on the second photoresist layer, thereby exposing the second photoresist layer under the interconnect trench pattern;

etching the second photoresist layer and transferring the interconnect trench pattern into the second photoresist layer using the third photoresist layer as a mask;

etching the first photoresist layer and the dielectric layer sequentially using the third photoresist layer as a mask, thereby transferring the interconnect trench pattern into the dielectric layer and forming an interconnect trench, and continuously etching the dielectric layer along the via contact hole pattern to form a via contact hole in the dielectric layer;

forming a conductive layer on the dielectric layer and filling the via contact hole and the interconnect trench; and polishing the conductive layer until the dielectric layer is exposed to achieve a damascene interconnecting line structure with a via contact.

9. The method as claimed in claim 8, wherein the dielectric layer includes a material selected from the group consisting of $SiO_2$, borosilicate glass (BSG), borophosphate silicate glass (BPSG), fluorosilicate glass (FSG), and tetra-ethyl-ortho-silicate (TEOS).

10. The method as claimed in claim 9, wherein the polishing step comprises chemical mechanical polishing (CMP).

11. The method as claimed in claim 8, wherein the first and the third photoresists are chemically amplified silicon photoresist.

12. The method as claimed in claim 8, wherein the first and the third photoresists are selected from different photoresists.

13. The method as claimed in claim 8, wherein the second photoresist is I-line photoresist.

14. The method as claimed in claim 8, wherein the depth of the interconnect trench is adjusted by altering etching parameters, thereby changing the ratio of etching rates of the first or third photoresist and the second photoresist.

15. The method as claimed in claim 8, wherein the etching rate of the second photoresist is higher than the etching rate of the first/third photoresist, wherein the ratio of the etching rates is about 5–15:1.

16. The method as claimed in claim 8, wherein during etching the second photoresist and the first photoresist, the etching rate of the dielectric layer and the etching rate of the first photoresist are equal.

17. The method as claimed in claim 8, wherein the conductive layer is metal.

18. The method as claimed in claim 8, wherein the conductive layer is Au, Cu, Ag, Al, W, or alloys thereof.

* * * * *